United States Patent
Okayama et al.

(10) Patent No.: US 6,670,546 B2
(45) Date of Patent: Dec. 30, 2003

(54) RADIO WAVE ABSORBER

(75) Inventors: Katsumi Okayama, Kanagawa (JP); Junichi Toyoda, Tokyo (JP); Yoshihiro Kato, Miyagi (JP); Satoshi Sugimoto, Miyagi (JP); Koichiro Inomata, Miyagi (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/181,384

(22) PCT Filed: Nov. 20, 2001

(86) PCT No.: PCT/JP01/10112
§ 371 (c)(1),
(2), (4) Date: Jul. 17, 2002

(87) PCT Pub. No.: WO02/43460
PCT Pub. Date: May 30, 2002

(65) Prior Publication Data
US 2003/0047338 A1 Mar. 13, 2003

(30) Foreign Application Priority Data
Nov. 21, 2000 (JP) .......................... 2000-354253

(51) Int. Cl.$^7$ ................................................. H05K 9/00
(52) U.S. Cl. ................................................. 174/35 MS
(58) Field of Search ............... 174/35 R, 35 MS; 361/816, 818, 800

(56) References Cited

U.S. PATENT DOCUMENTS

| | | | | |
|---|---|---|---|---|
| 4,948,922 A | * | 8/1990 | Varadan et al. | 174/35 GC |
| 5,938,979 A | | 8/1999 | Kambe et al. | 252/500 |
| 6,416,830 B2 | * | 7/2002 | Yoshida et al. | 428/34.5 |

FOREIGN PATENT DOCUMENTS

| | | |
|---|---|---|
| JP | 175031 | 7/1993 |
| JP | 11-177273 | 7/1999 |
| JP | 11-269503 | 10/1999 |
| JP | 2000-307287 | 11/2000 |

* cited by examiner

*Primary Examiner*—Hung V. Ngo
(74) *Attorney, Agent, or Firm*—Sonnenschein, Nath & Rosenthal LLP

(57) ABSTRACT

There is disclosed a thinner-layered radio wave absorber having high absorption performance for a high frequency electromagnetic wave. The radio wave absorber, even when having a magnetic layer of not more than 1 mm in thickness, achieves satisfactory absorption characteristics for the high frequency electromagnetic wave by adopting a structure that a conductor is fixedly attached to a face opposite to an electromagnetic-wave incident face of the magnetic layer of single-layered structure, and also arranging the magnetic layer to have values of a real part $\mu'$ and an imaginary part $\mu''$ of complex relative magnetic permeability of the magnetic layer satisfying an expression of $\mu'' \geq m\mu' - n$ (m: real number of m>0, n: real number of n≥0) outside an impedance mismatching region.

11 Claims, 14 Drawing Sheets

RADIO WAVE ABSORBER 10

MAGNETIC LAYER 11
CONDUCTOR 12

RADIO WAVE ABSORBER

TECHNICAL FIELD

This invention relates to an impedance-matching radio wave absorber, and more specifically, to a thin-layered radio wave absorber useful for absorption of high frequency electromagnetic waves.

BACKGROUND OF THE INVENTION

Recently, with a demand for higher frequency of a signal used with electronic equipment, a problem of useless radiation emitted from the electronic equipment becomes marked. Control of suppressing the useless radiation from the electronic equipment may be made by a method for making a change to circuit designs, or employing anti-useless radiation components and so on. However, use of these methods becomes more and more difficult for reasons of a demand for shorter period of product span and an increase in cost or the like. In this connection, there is a tendency toward use of a method for applying an anti-useless radiation sheet or the like made up of a sheet-shaped composite soft magnetic material having a magnetic loss even for high frequency electromagnetic waves.

A wireless LAN (Local Area Network), a superhighway automatic accounting system or like communication systems making use of high frequency radio waves have been also recently developed. However, in a radio wave-handling equipment applied to these communication systems, any radio wave other than a target signal wave results in radio disturbance, so that development of a radio wave absorber has been required for smooth communication by absorption of the generated radio disturbance. Electromagnetic wave in the frequency band of 2.45 GHz, for instance, is used with various kinds of electronic equipment such as an electronic oven, a portable information terminal, a wireless LAN and a Bluetooth, and smooth communication when using these pieces of electronic equipment without mutual malfunctions is of importance.

While the radio wave absorber is useful to transform energy of incident radio wave into heat for absorption, it is supposed that a loss term $\in''$ (an imaginary component of a complex relative permittivity) of a relative permittivity of the radio wave absorber and a loss term $\mu''$ (an imaginary component of a complex relative magnetic permeability) of a relative magnetic permeability are related to transformation of the energy of incident radio wave. When incidence of a radio wave on a material having a loss as described above occurs, the energy of the radio wave is transformed into heat for absorption according to the following expression (1).

$$P = \tfrac{1}{2}\omega\in_0\in''|E^2| + \tfrac{1}{2}\omega\mu_0\mu''|H^2| \tag{1}$$

In the above expression (1), P represents wave absorption energy [W/m³] per unit volume, $\omega$ is the angular frequency ($2\pi f$, f: frequency of electromagnetic wave) of an electromagnetic wave, $\in_0$ is magnetic permeability of free space, $\in''$ is an imaginary component of a complex relative permittivity (a dielectric loss), E is electric field strength of an electromagnetic wave applied from the outside, $\mu_0$ is magnetic permeability of free space, $\mu''$ is an imaginary component of a complex relative magnetic permeability (a magnetic loss), and H is magnetic field strength of the electromagnetic wave applied from the outside.

According to the above expression (1), the higher loss that a material has, the greater will be the radio wave absorptive power. However, in a case of a plane wave in a relatively remote electromagnetic field at a distance of not less than $\lambda/6$ ($\lambda$: wavelength of an electromagnetic wave) from a wave source, if incidence of a radio wave on such a high loss material just for once is all that occurs, complete absorption of energy of the radio wave for transformation into heat is made impossible in most cases. This is because reflection takes place on a front face of the radio wave absorber for reason of a difference in impedance between air and the radio wave absorber.

Accordingly, in the radio wave absorber for absorption of a plane wave, a back face of the radio wave absorber is backed with a conductor, and absorption of the radio wave is made by a method for controlling phase of a reflected wave in an interface between the conductor and the radio wave absorber and a reflected wave in the front face of the radio wave absorber to offset the reflected waves each other. The wave absorber implemented by taking the above method is called an impedance-matching wave absorber. The impedance-matching radio wave absorber normally aims at a return loss of 20 dB, which is considered to be equivalent to a value representing 99% absorption of the energy of the radio wave, in most cases.

It is necessary for the impedance-matching radio wave absorber used for the high frequency band of not less than 1 GHz to have high relative magnetic permeability and high electric resistance. Conventionally, rubber ferrite, for instance, has been heretofore widely used as a material of the impedance-matching radio wave absorber. Otherwise, carbonyl iron, form styrol carbon or the like has been also in use. In the impedance-matching radio wave absorber, a matching frequency and a matching thickness are determined once a material constant is established. A thickness of about 1 cm, when using rubber ferrite or the like, is required for the electromagnetic wave in the frequency band of 2.45 GHz, resulting in use of the radio wave absorber having the above thickness in the conventional technique. However, with the progress of miniaturization of electronic equipment such as the portable information terminal, for instance, there is a need for smaller thickness of the radio wave absorber to reduce the proportion of a radio wave absorber size to an equipment size. In this connection, development of a radio wave absorber, which meets demands for smaller thickness and lighter weight while keeping up radio wave absorption performance with the use of a material of higher relative magnetic permeability, has been desired.

On the other hand, a thin film material containing Co is known as a material having high relative magnetic permeability enough to cover the high frequency band, as disclosed in Japanese Patent Application Laid-open No. 10-241938, for instance. Using this thin film material meets both high magnetic permeability and high electric resistance in a Co—Ni—Al—O thin film or the like by adopting a granular structure composed of two or more kinds of fine structures such as fine magnetic particles limited in particle size to about 4 to 7 nm and grain boundaries of extremely thin ceramic film surrounding the fine magnetic particles. However, the thin film material in this case is formed in the shape of a thin film using a sputtering device, resulting in no application to a material of practical use as the radio wave absorber.

A multi-layered radio wave absorber including a magnetic layer consisting of the above material is also often applied as the impedance-matching radio wave absorber. The structure available may be that having a dielectric layer on the front face of a magnetic layer backed with the conductor as described above and so on, for instance. As compared with a single-layered radio wave absorber, the multi-layered wave absorber has advantages of easily managing matching of a reflected wave phase by reason that reflection is subjected to the control as impedance of an incident face nears space impedance, whereas having disadvantages of increasing the production cost. For that reason, in producing the impedance-matching radio wave absorber, there is a need for selection of a material and a structure in consideration of the above advantages and disadvantages, while difficulty has been experienced in passing decision on selection of the material and the structure.

The present invention is provided in view of the above circumstances, and its object is to provide a thinner-layered radio wave absorber, which permits exact selection of a material and a structure and achieves high absorption performance for high frequency electromagnetic wave.

SUMMARY OF THE INVENTION

According to the present invention, in order to solve the above problems, there is provided, in an impedance-matching radio wave absorber, a radio wave absorber comprising a magnetic layer having a thickness of not more than 1 mm and arranged to have values of a real part $\mu'$ and an imaginary part $\mu''$ of complex relative magnetic permeability satisfying the expression of $\mu'' \geq m\mu'-n$ (m: real number of m>0, n: real number of n≧0) outside an impedance mismatching region, and a conductor fixedly attached to a face opposite to an electromagnetic-wave incident face of the magnetic layer.

The above radio wave absorber, even when having the magnetic layer of not more than 1 mm in thickness, achieves satisfactory absorption characteristics for high frequency electromagnetic wave by adopting the structure that the conductor is fixedly attached to the face opposite to the electromagnetic-wave incident face of the magnetic layer of single-layered structure, and arranging the magnetic layer to have the values of the real part $\mu'$ and the imaginary part $\mu''$ of the complex relative magnetic permeability of the magnetic layer satisfying the expression of $\mu'' \geq m\mu'-n$ (m: real number of m>0, n: real number of n≧0) outside the impedance mismatching region. When the relative permittivity of the magnetic layer is not more than 15, the return loss of not less than 20 dB is achieved for the electromagnetic wave in the frequency band of 2.4 to 2.5 GHz, for instance, on the assumption that $4 \leq m \leq 6$ and $n \leq 30$, while the return loss of not less than 10 dB is achieved on the assumption that $1.2 \leq m \leq 1.5$ and $n \leq 10$. When the relative permittivity of the magnetic layer is not more than 50, the return loss of not less than 20 dB is also achieved on the assumption that $4 \leq m \leq 6$ and $n \leq 100$, while the return loss of not less than 10 dB is achieved on the assumption that $1.2 \leq m \leq -1.5$ and $n \leq 30$. Using a magnetic material of fine textural structure limited in particle size to 1 to 100 nm in the shape of powder, for instance, for dispersion into a polymeric material or the like permits formation of the magnetic layer.

According to the present invention, there is also provided, in an impedance-matching radio wave absorber, a radio wave absorber, which comprises a radio wave absorptive layer having a thickness of not more than 1 mm and adopting a multi-layered structure including a magnetic layer arranged to have values of a real part $\mu'$ and an imaginary part $\mu''$ of complex relative magnetic permeability satisfying the expression of $\mu'' \geq m\mu'-n$ (m: real number of m>0, n: real number of n≧0), and a conductor fixedly attached to a face opposite to an electromagnetic-wave incident face of the radio wave absorptive layer.

The above radio wave absorber, even when having the magnetic layer of not more than 1 mm in thickness, achieves satisfactory absorption characteristics for high frequency electromagnetic wave by adopting the structure that the conductor is fixedly attached to the face opposite to the electromagnetic-wave incident face of the radio wave absorptive layer including the magnetic layer, and also arranging the magnetic layer to have the values of the real part $\mu'$ and the imaginary part $\mu''$ of the complex magnetic permeability of the magnetic layer satisfying the expression of $\mu'' \geq m\mu'-n$ (m: real number of m>0, n: real number of n≧0). When the relative permittivity of the magnetic layer is not more than 15, the return loss of not less than 20 dB is achieved for the electromagnetic wave in the frequency band of 2.4 to 2.5 GHz, for instance, on the assumption that $4 \leq m \leq 6$ and $n \leq 30$, while the return loss of not less than 10 dB is achieved on the assumption that $1.2 \leq m \leq 1.5$ and $n \leq 10$. When the relative permittivity of the magnetic layer is not more than 50, the return loss of not less than 20 dB is also achieved on the assumption that $4 \leq m \leq 6$ and $n \leq 100$, while the return loss of not less than 10 dB is achieved on the assumption that $1.2 \leq m \leq 1.5$ and $n \leq 30$. Using a magnetic material of the fine textural structure limited in particle size to 1 to 100 nm in the shape of powder, for instance, for dispersion into a polymeric material or the like permits formation of the magnetic layer. The radio wave absorptive layer has a dielectric layer formed by kneading of ceramics with a polymeric material, for instance, in addition to the magnetic layer.

BRIEF DESCRIPTION OF THE DRAWINGS

FIG. 12 shows a matching region sufficient to achieve absorption characteristics of not less than −10 dB in a case where the relative permittivity ∈ of the magnetic layer is assumed to be 15 when using the single-layered radio wave absorber;

FIG. 14 shows wave absorption characteristics in a first embodiment.

DETAILED DESCRIPTION OF THE PRESENTLY PREFERRED EMBODIMENTS

Figure 1:
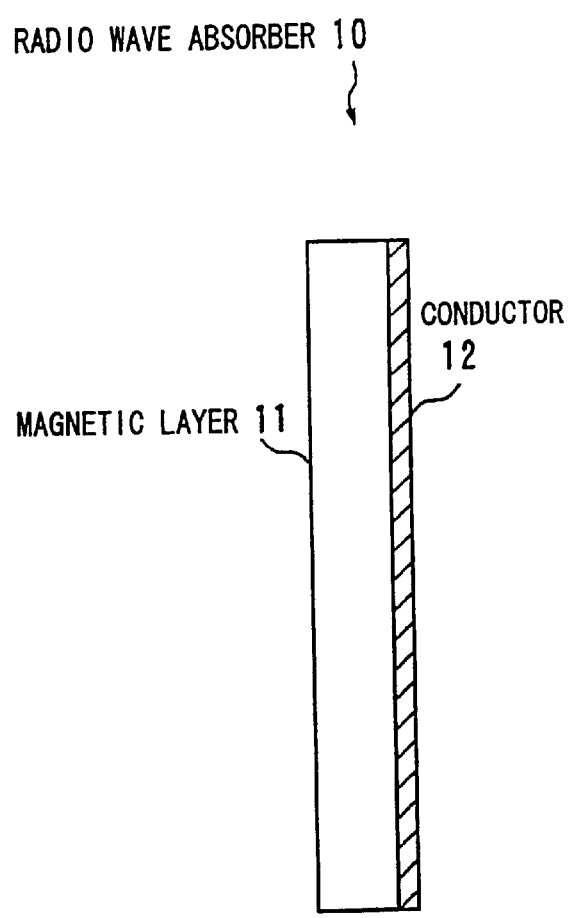
FIG. 1 is a view showing a structure of a radio wave absorber made up of a magnetic layer of single-layered structure.

Hereinafter will be described an embodiment of the present invention with reference to the accompanying drawings. FIG. 1 shows a structure of a radio wave absorber made up of a magnetic layer of single-layered structure.

The radio wave absorber according to the present invention is an impedance-matching radio wave absorber having a structure that a back face of a radio wave absorptive layer made up of a magnetic layer or the like is backed with a conductor. The radio wave absorber of the above structure is useful for absorption of a radio wave by controlling phase of a reflected wave in an interface between the radio wave absorptive layer and the conductor and a reflected wave in a front face of the wave absorptive layer so as to offset the reflected waves each other in such a manner of allowing space impedance to match impedance of the radio wave absorptive layer by controlling the thickness of the radio wave absorptive layer. The radio wave absorber has an effect of absorbing a plane wave in a relatively remote electromagnetic field at a distance of not less than λ/6 from a wave source. As one embodiment of the impedance-matching radio wave absorber, there is shown, in FIG. 1, a radio wave absorber 10 comprising a magnetic layer 11 of single-layered structure that a face opposite to a wave incident direction of the magnetic layer 11 is backed with a metal plate as a conductor 12. The single-layered radio wave absorber 10 as described above has advantages of holding down its production cost, since there is less need for production steps, as compared with a multi-layered radio wave absorber which will be described later.

In general, the impedance-matching radio wave absorber gives effect to non-reflection in a target frequency by designing a material constant to satisfy the following expression (2), and also by controlling the thickness of the radio wave absorptive layer.

$$1 = \sqrt{\frac{\mu}{\varepsilon}} \tanh\left(\frac{2\pi f d}{c} i\sqrt{\varepsilon\mu}\right) \quad (2)$$

Wherein i represents an imaginary unit, and d is the thickness of the radio wave absorber.

Figure 2:
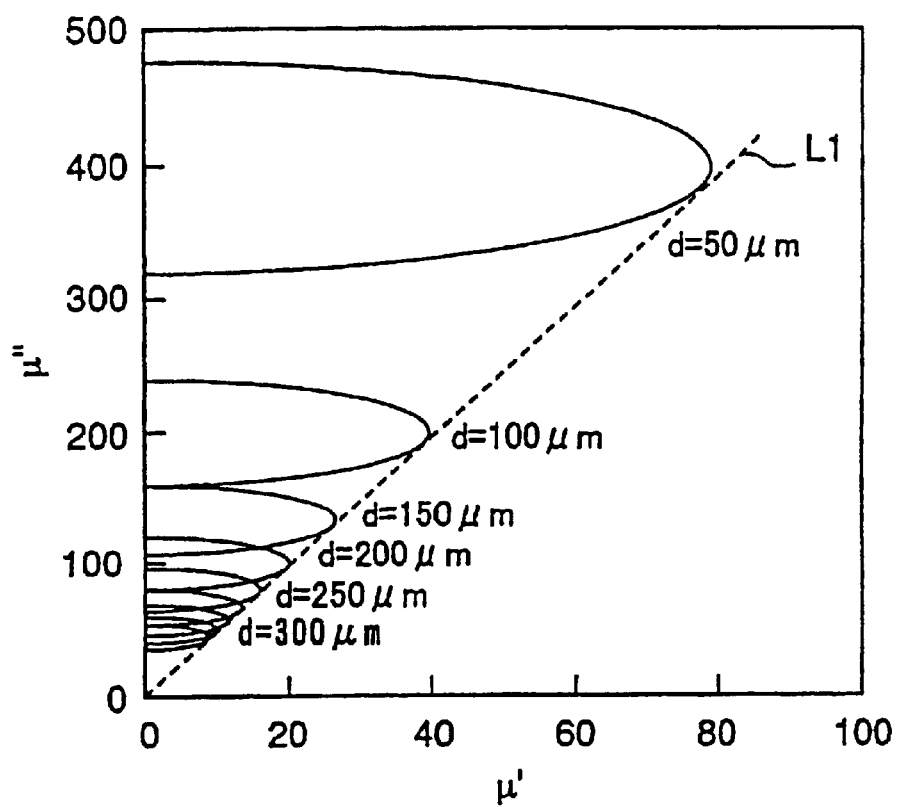
FIG. 2 shows relative magnetic permeability required in a case where the thickness of the magnetic layer is made variable when using the single-layered radio wave absorber.

In this connection, there will be given of the search for a material constant enough to satisfy the above expression (2) in the following description. FIG. 2 is a graph showing relative magnetic permeability required in a case where the thickness of the magnetic layer 11 is made variable when using the single-layered radio wave absorber 10 shown in FIG. 1.

In FIG. 2, there are shown values of a real part $\mu'$ and an imaginary part $\mu''$ of complex relative magnetic permeability sufficient to achieve a return loss of 20 dB for the electromagnetic wave in a frequency band of 2.45 GHz, for instance. The electromagnetic wave in the frequency band of 2.45 GHz is used with various kinds of electronic equipment such as an electronic oven, a portable information terminal and a wireless LAN, and is supposed to be that required for smooth communication when using these pieces of electronic equipment without mutual malfunctions. Incidentally, the relative permittivity ∈ of the magnetic layer 11 is assumed to be 1. In FIG. 2, inside of each boundary given in a semi-elliptical shape represents a matching region meeting the above requirements, and there are shown the matching regions respectively corresponding to cases where a thickness is limited to 50 μm, 100 μm, 150 μm, 200 μm, 250 μm, 300 μm and more than 300 μm in a descending scale. It is ascertained from FIG. 2 that the relative magnetic permeability required for the magnetic layer 11 to meet the amount of absorption as much as −20 dB increases with the decreasing thickness of the magnetic layer 11.

Incidentally, a description regarding a dotted line in FIG. 2 will be given later.

Figure 3:
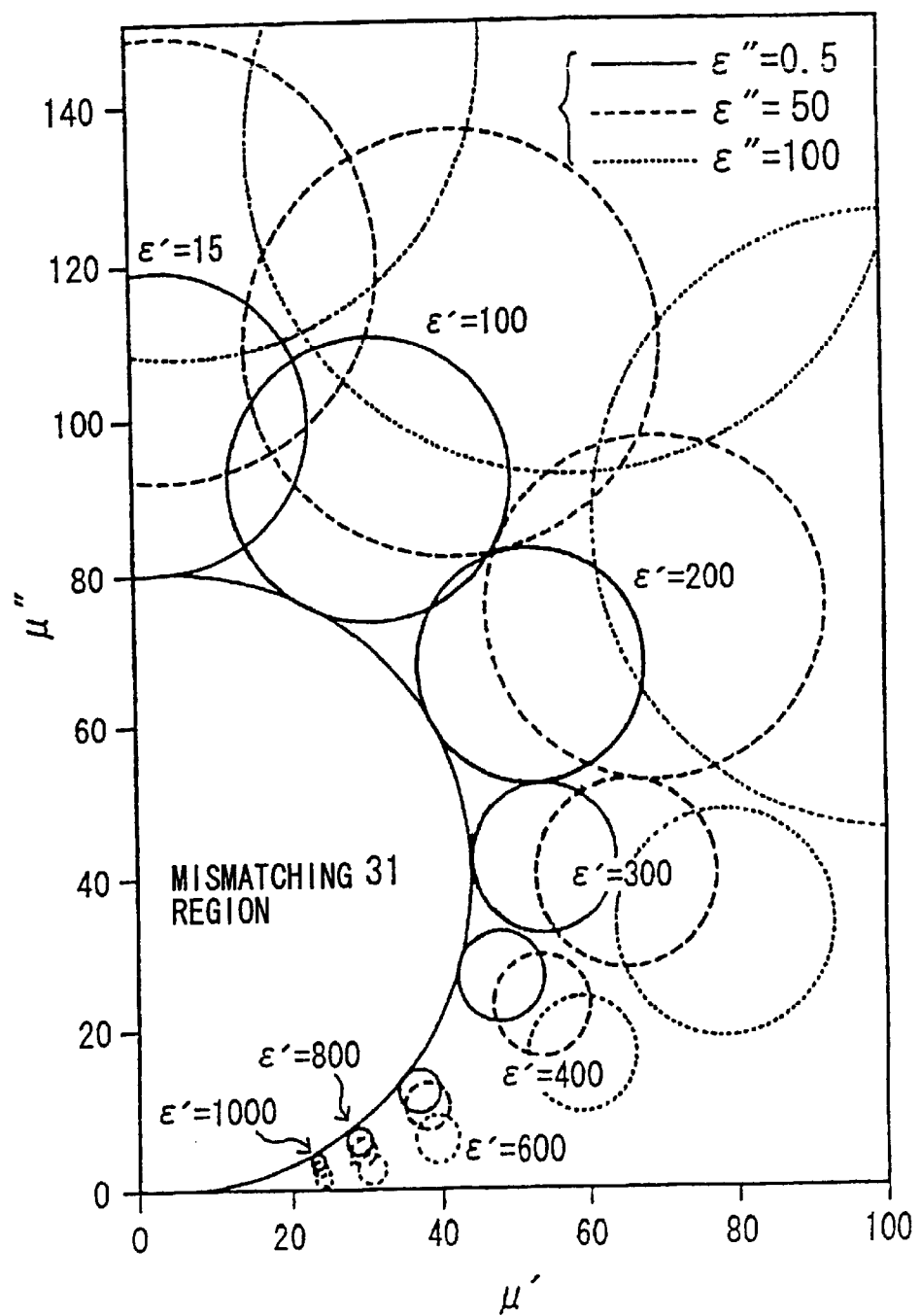
FIG. 3 shows the relative magnetic permeability $\mu$ required in a case where relative permittivity $\in$ of the magnetic layer is made variable on condition that the thickness of the magnetic layer is fixed.

FIG. 3 is a graph showing the relative magnetic permeability $\mu$ required in a case where the relative permittivity ∈ of the magnetic layer 11 is made variable on condition that the thickness of the magnetic layer is fixed. In FIG. 3, there is shown a case where the relative permittivity ∈ of the magnetic layer 11 is made variable on condition that the thickness of the magnetic layer is limited to 200 μm when using the single-layered radio wave absorber 10, similarly to FIG. 2, in which inside of each circle given outside a mismatching region 31 represents values of a real part $\mu'$ and an imaginary part $\mu''$ of the complex relative magnetic permeability sufficient to achieve the return loss of 20 dB for the electromagnetic wave in the frequency band of 2.45 GHz. The circles representing the regions meeting the above requirements are shown by solid lines, broken lines and dotted lines respectively corresponding to cases where ∈"=0.5, 50 and 100 on condition that the value of the real part ∈' of the complex relative permittivity is varied in a range from 15 to 1000 and value of the imaginary part ∈" thereof is further varied depending on each value of the real part.

As a result of measurement, inside of the mismatching region 31 given in a semicircular shape in FIG. 3 is considered to be a region insufficient to achieve the absorption characteristics of not less than −20 dB although the relative permittivity ∈ is limited to any value. Thus, even if a material that takes the values of the real part $\mu'$ and the imaginary part $\mu''$ of the complex relative magnetic permeability included in the mismatching region 31 is used, no satisfactory radio wave absorber meeting the above requirements is available. It is also understood that a value of the required relative magnetic permeability decreases with the increasing relative permittivity dielectric constant for achievement of the above absorption characteristics. It is ascertained from FIG. 3, for instance, that supposing that a magnetic material of about 300 in relative permittivity is used as the magnetic layer 11, the complex relative magnetic permeability of about $\mu$=60–40j is all that is required to produce the thin-layered radio wave absorber of 200 μm in thickness.

Figure 4:
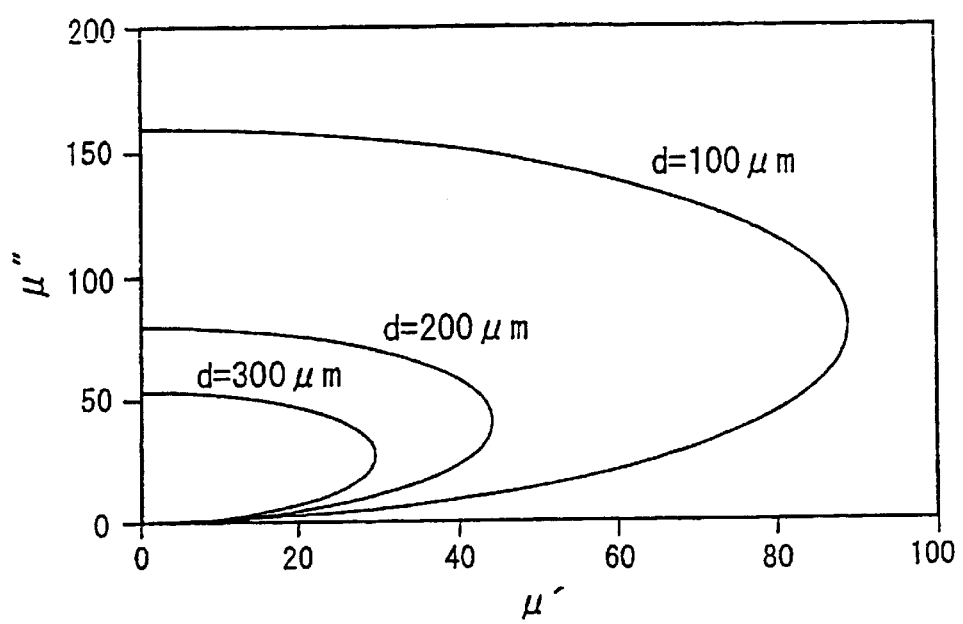
FIG. 4 shows the relative magnetic permeability $\mu$ required in a case where the thickness of the magnetic layer is made variable.

From a standpoint that use of the magnetic material showing the relative magnetic permeability within the above mismatching region is beyond a range of possibility of producing a satisfactory radio wave absorber in the present invention, examinations on a boundary of the mismatching region will be given next. FIG. 4 is a graph showing the relative magnetic permeability $\mu$ required in a case where the thickness of the magnetic layer 11 is made variable.

In FIG. 4, there is shown how a boundary of the mismatching region insufficient to achieve the absorption of not less than −20 dB varies in the case where the thickness of the magnetic layer 11 is made variable in a range from 100 to 300 $\mu$m on condition that the frequency of a target electromagnetic wave is limited to 2.45 GHz when using the single-layered radio wave absorber 10 similarly. As a result, a semi-elliptical mismatching region having a similar shape to that shown in FIG. 3 has been obtained correspondingly to each thickness of the magnetic layer 11. It is ascertained from FIG. 4 that the smaller the thickness of the magnetic layer 11 is, the greater the mismatching region is, resulting in a need for higher relative magnetic permeability.

Figure 5:
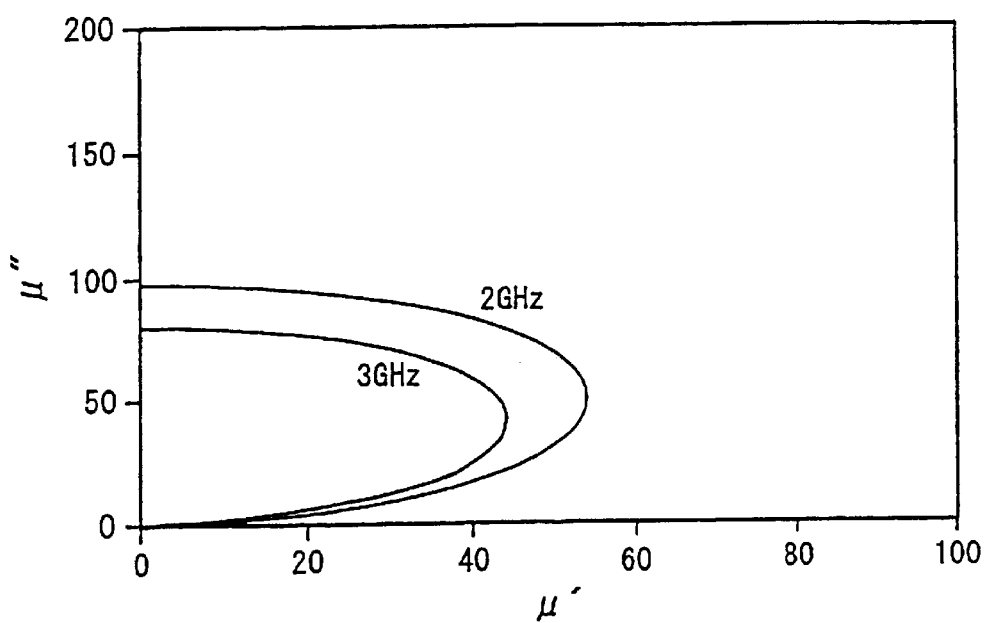
FIG. 5 shows the relative magnetic permeability $\mu$ required in a case where a frequency of a target electromagnetic wave is made variable on condition that the thickness of the magnetic layer is fixed.

FIG. 5 is a graph showing the relative magnetic permeability $\mu$ required in a case where the frequency of target electromagnetic wave is made variable on condition that the thickness of the magnetic layer 11 is fixed. In FIG. 5, there is shown how a boundary of the mismatching region insufficient to achieve the absorption characteristics of not less than −20 dB varies in the case where the frequency of target electromagnetic wave is made variable in a range from 2 to 3 GHz on condition that the thickness of the magnetic layer 11 is limited to 200 $\mu$m when using the single-layered radio wave absorber 10 similarly. As a result, a semi-elliptical mismatching region having a similar shape to that shown in FIG. 3 has been obtained correspondingly to the electromagnetic wave of each frequency. It is ascertained from FIG. 5 that the lower the frequency is, the higher will be the relative magnetic permeability required to achieve the satisfactory absorption characteristics for the target electromagnetic wave.

The above results may formulate a guiding principle to the effect that there are needs for calculation of the mismatching region as shown in FIGS. 3 and 4 and also design using a material that the relative magnetic permeability is assumed to be a value outside the mismatching region in order to produce the single thin-layered radio wave absorber 10 having the magnetic layer 11 of not more than 1 mm in thickness.

Figure 6:
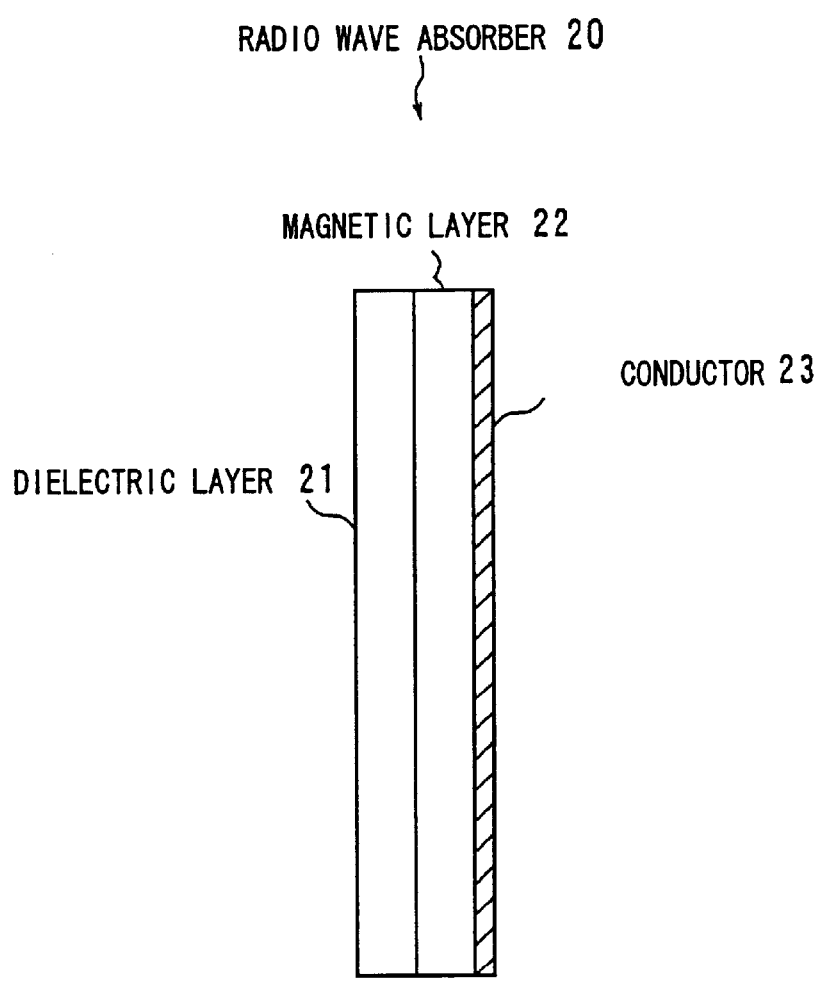
FIG. 6 is a view showing a structure of a radio wave absorber made up of a radio wave absorptive layer of multi-layered structure.

Examinations on a radio wave absorber having a wave absorptive layer of multi-layered structure including the magnetic layer as one embodiment of the thin-layered radio wave absorber having the above absorption performance will be given next. FIG. 6 shows a structure of a radio wave absorber made up of a radio wave absorptive layer of multi-layered structure, for instance.

A radio wave absorber 20 shown in FIG. 6 has a structure that a dielectric layer 21 consisting of a dielectric material and a magnetic layer 22 are layered as a radio wave absorptive layer on an electromagnetic wave incident face, and the radio wave absorptive layer is backed with a conductor 23. The radio wave absorber 20 permits a reflected wave phase to be easily matched by a reason that reflection is subjected to the control as impedance of the incident face nears space impedance in a manner of providing the magnetic layer 22 of high relative magnetic permeability on the side of the backed conductor 23 while providing the dielectric layer 21 on the electromagnetic-wave incident face side. Incidentally, the multi-layered radio wave absorber may also be of a structure having a plurality of magnetic layers or dielectric layers and so on, without being limited to the above structure.

Figure 7:
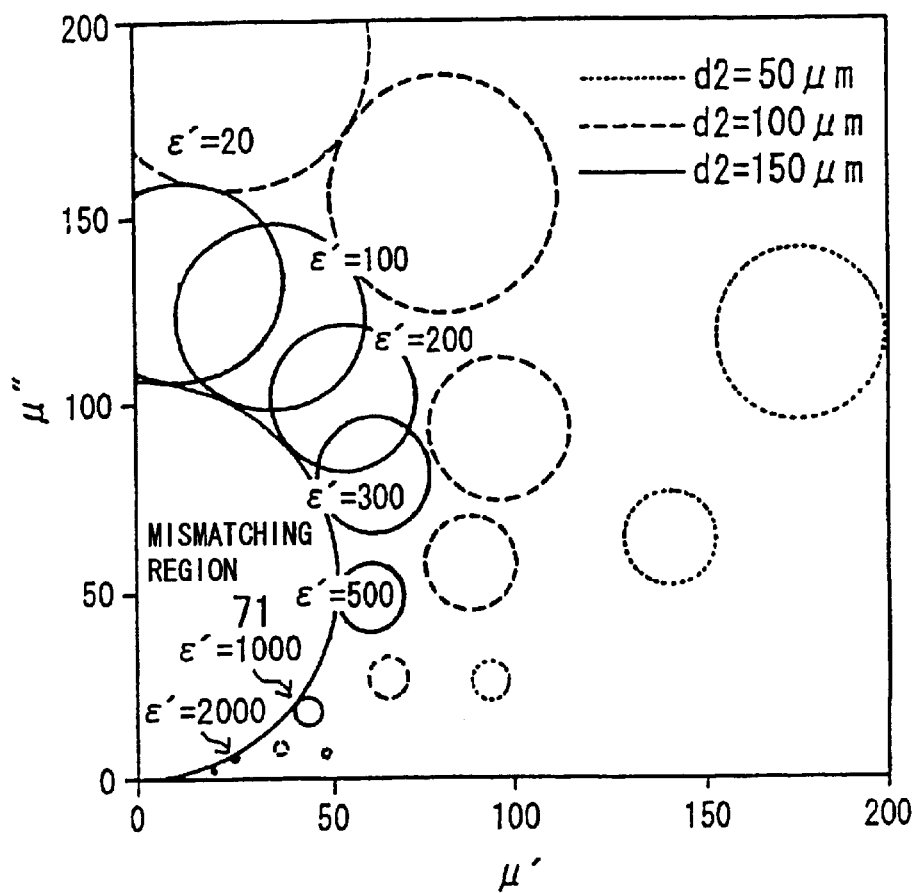
FIG. 7 shows the relative magnetic permeability $\mu$ required in a case where the relative permittivity dielectric constant and the thickness of a dielectric layer are made variable when using the multi-layered wave absorber.

FIG. 7 is a graph showing a relative magnetic permeability $\mu$ required in a case where relative permittivity and thickness of the dielectric layer 21 are made variable when using the multi-layered radio wave absorber 20 shown in FIG. 6. In FIG. 7, there are shown, in the shape of circles, regions of the relative magnetic permeability sufficient to achieve the absorption of not less than 20 dB in a case where a real part $\in'$ of complex relative permittivity and the thickness d2 of the dielectric layer 21 are made variable on condition that the dielectric layer 21 and the magnetic layer 22 are held to be 200 $\mu$m in total thickness, the values of the real part $\in'$ and an imaginary part $\in''$ of the complex relative permittivity of the magnetic layer 22 are respectively assumed to be 15 and 0.5, while the values of the real part $\mu'$ and the imaginary part $\mu''$ of the complex relative magnetic permeability of the dielectric layer 21 are respectively assumed to be 1 and 0 and the value of the imaginary part $\in''$ of the complex relative permittivity of the dielectric layer 21 is assumed to be 0 when using the radio wave absorber 20. Referring to FIG. 7, a semicircular range shown at the bottom left-hand corner is considered to be a mismatching region 71 insufficient to achieve the above absorption characteristics even though the relative magnetic permeability takes on any value within this semicircular range, and it is also ascertained that use of the magnetic layer 22 with variations in relative magnetic permeability value is possible on the outside of the mismatching region by varying the relative permittivity value and the thickness of the dielectric layer 21.

Selecting the material fit for use on the basis of the above result of examinations permits implementation of the radio wave absorber of the present invention. As described the above, there may be two ways of implementing the wave absorber of the present invention, that is, one of single-layered structure having a radio wave absorptive layer composed of only a magnetic layer and the other of multi-layered structure including a magnetic layer. The single-layered radio wave absorber has the advantages of holding down the production cost by reasons that there is less need for production steps as compared with the multi-layered radio wave absorber having a plurality of layers bonded together, and that control of the thickness is made easier. In this connection, examinations on what kind of requirements is required for the optimum design of the radio wave absorber will be given next.

Figure 8:
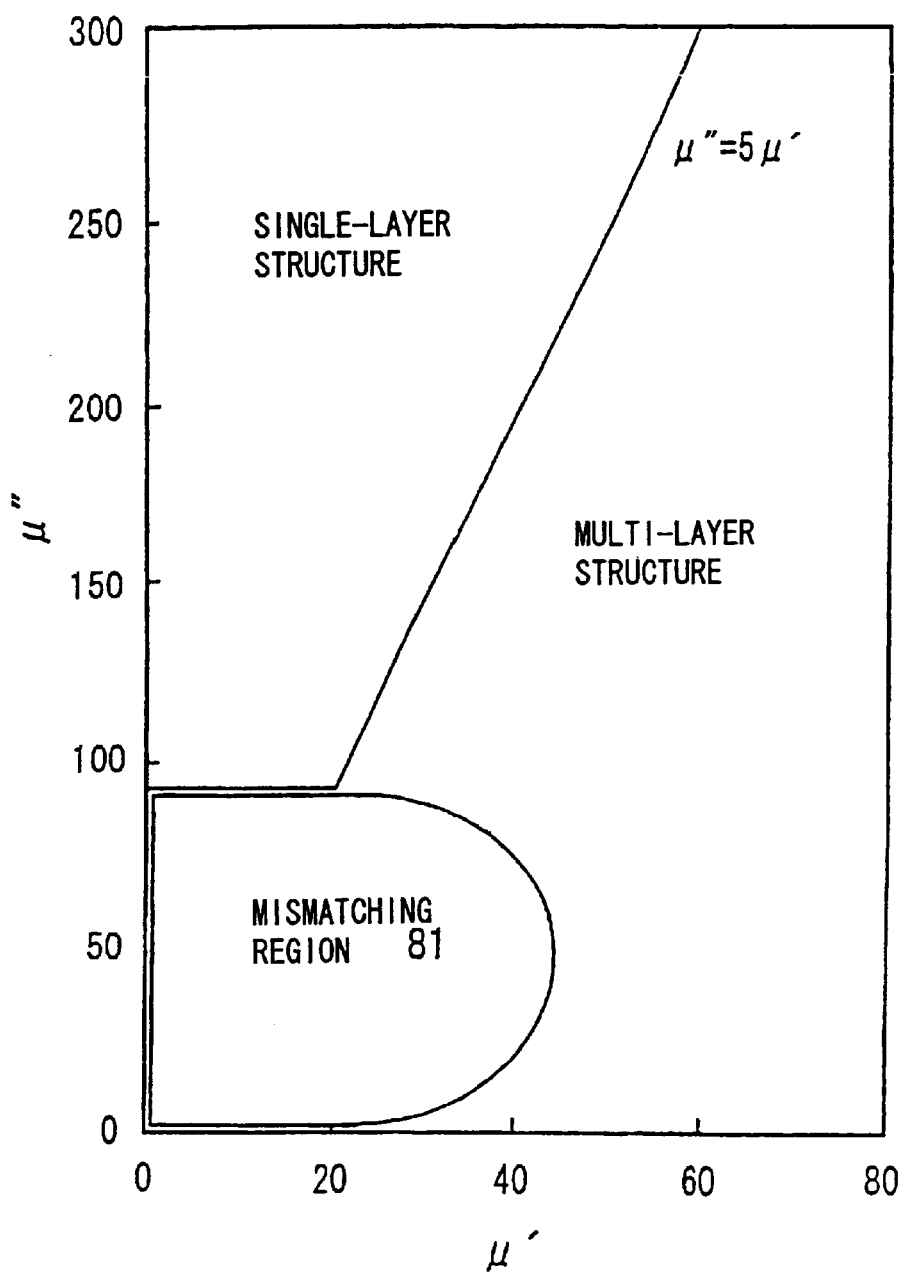
FIG. 8 is a graph showing requirements for selection of an optimum material for the relative magnetic permeability of a magnetic layer.

FIG. 8 is a graph showing most suitable requirements for selection of the materials with regard to the relative magnetic permeability of the magnetic layer. In FIG. 8, there is shown a region sufficient to achieve the absorption of not less than −20 dB when a frequency of the target electromagnetic wave is limited to 2.45 GHz, and thickness of the radio wave absorptive layer is also limited to not more than 200 $\mu$m. A semi-elliptical range shown at the bottom left-hand corner is considered to be a mismatching region 81, and when the relative magnetic permeability of the magnetic layer lies within this mismatching region, neither the single-layered radio wave absorber nor the multi-layered radio wave absorber achieves the satisfactory absorption performance.

Referring to FIG. 2, when using the single-layered radio wave absorber, the region of the relative magnetic permeability sufficient to achieve the absorption characteristics of −20 dB decreases with the increasing thickness of the magnetic layer. However, the above region of the relative magnetic permeability in the drawing exists within a region where the imaginary part $\mu''$ of the complex relative magnetic permeability takes a value greater than a line that goes up from the origin at a certain gradient, that is, within a region satisfying the expression of $\mu'' \geq m\mu'-n$ (m: real number of m>0, n: real number of n $\geq$0). When meeting the requirements in FIG. 2, the values of m and n are respectively assumed to be about 5 and about 0. Thus, the real part $\mu'$ and the imaginary part $\mu''$ of the complex relative magnetic permeability of the magnetic layer should take values meeting the requirements given by the expression of $\mu'' \geq m\mu'-n$ in order that the single-layered radio wave absorber may achieve the satisfactory absorption characteristics for certain frequency electromagnetic wave in the high frequency band. On the other hand, referring to FIG. 7, when using the multi-layered radio wave absorber, the relative magnetic permeability of the magnetic layer may basically take values in the substantially whole region except the mismatching region 81 in a manner of controlling the relative permittivity and the thickness of the dielectric layer.

As described the above, as shown in FIG. 8, using the complex relative magnetic permeability of the magnetic layer may apply a straight line representing the expression of $\mu'' \geq m\mu'-n$ (m: real number of m>0, n: real number of n$\geq$0) as the criterion for judgment on design in order to permit production of the wave absorber sufficient to achieve the satisfactory absorption characteristics, in a region except the mismatching region 81. Accordingly, it may be judged that the region satisfying the expression of $\mu'' \geq m\mu'-n$ is advantageous in producing the single-layered radio wave absorber, while the other region is advantageous in producing the multi-layered radio wave absorber. In this connection, verifications on the values of m and n in the above expression will be given next.

Figure 9:
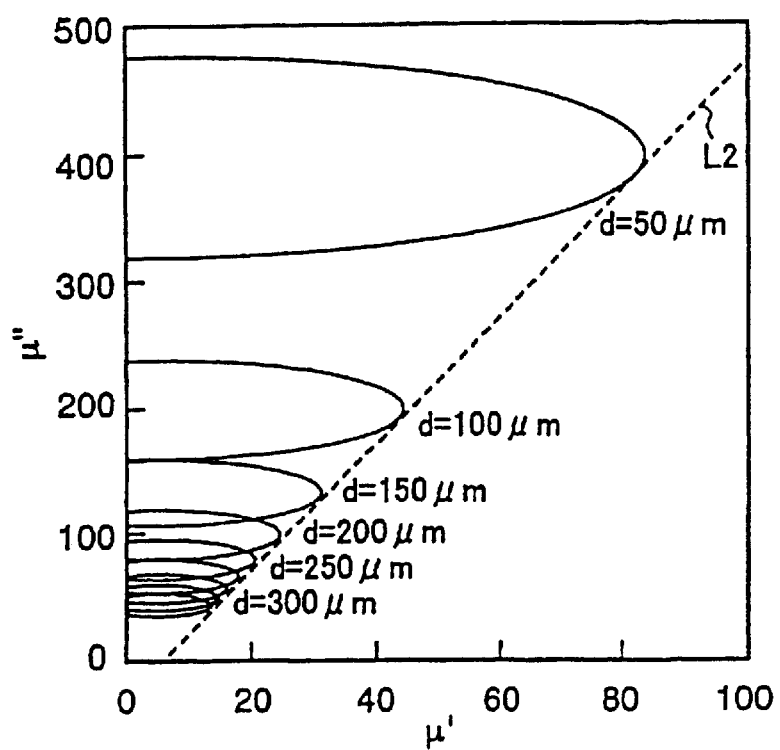
FIG. 9 shows a matching region sufficient to achieve absorption characteristics of not less than −20 dB in a case where the relative permittivity e of the magnetic layer is assumed to be 15 when using the single-layered radio wave absorber.
Figure 10:
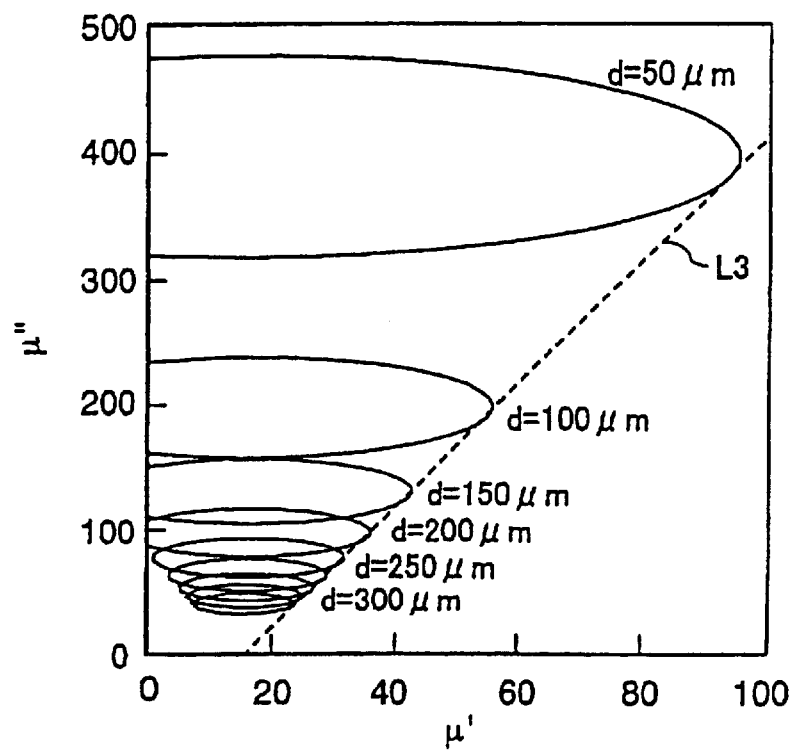
FIG. 10 shows a matching region sufficient to achieve absorption characteristics of not less than −20 dB in a case where the relative permittivity $\in$ of the magnetic layer is assumed to be 50 when using the single-layered radio wave absorber.

Firstly, a description will be given of verifications on a guiding principle on selection of a material for the magnetic layer to achieve the absorption characteristics of −20 dB when using the single-layered radio wave absorber. FIG. 9 shows a matching region in a case where the relative permittivity $\in$ of the magnetic layer is assumed to be 15. FIG. 10 shows a matching region in a case where the relative permittivity $\in$ is assumed to be 50. Verifications on the values of m and n to meet the absorption characteristics of −20 dB with reference to FIGS. 9 and 10 will be given next.

In FIGS. 2, 9 and 10, there are shown, every value of the relative permittivity $\in$ of the magnetic layer, matching regions sufficient to achieve the absorption characteristics of −20 dB in a case where the thickness d of the magnetic layer is made variable on condition that the frequency of the target electromagnetic wave is limited to 2.45 GHz. The value of the relative permittivity $\in$ of the magnetic layer in FIG. 2 is assumed to be 1, that in FIG. 9 is assumed to be 15 and that in FIG. 10 is assumed to be 50. In each of FIGS. 2, 9 and 10, there are shown the matching regions respectively corresponding to a cases where the thickness d of the magnetic layer is limited to 50 $\mu$m, 100 $\mu$m, 200 $\mu$m, 250 $\mu$m, 300 $\mu$m and more than 300 $\mu$m, as enclosed with substantially elliptical boundaries.

In FIGS. 9 and 10, the relative magnetic permeability $\in$ required for the magnetic layer to meet the amount of absorption of −20 dB increases with the decreasing thickness d, similarly to the case of FIG. 2. The matching regions appear on the left side of a straight line given at a certain gradient in each of FIGS. 9 and 10. The straight line as described above is shown by dotted lines as L1, L2 and L3 respectively in FIGS. 2, 9 and 10. Expressing each of the straight lines L1, L2 and L3 in terms of $\mu''=m\mu'-n$ gives m=5 and n=0 from FIG. 2 when the relative permittivity $\in$ is 1, gives m=4.3 and n=25 from FIG. 9 when the relative permittivity $\in$ is 15, and gives m=5.1 and n=75 from FIG. 10 when the relative permittivity $\in$ is 50.

According to the above results, the guiding principle for achievement of the return loss of not less than 20 dB for the target electromagnetic wave in the frequency band of 2.4 to 2.5 GHz when using the single-layered impedance-matching radio wave absorber may be set up on the basis of values of $4 \leq m \leq 6$ and $n \leq 30$ when the relative permittivity $\in$ of the magnetic layer is not more than 15 on condition that the relation of the real part $\mu'$ and the imaginary part $\mu''$ of the complex relative magnetic permeability of the material for the magnetic layer is given by the expression of $\mu'' \geq m\mu'-n$, while being set up on the basis of values of $4 \leq m \leq 6$ and $n \leq 100$ when the relative permittivity $\in$ of the magnetic layer is not more than 50. As described above, with the increased value of the relative permittivity $\in$ of the magnetic layer, the value of n representing the distance from the origin gradually increases without a greater change of the value m representing the gradient, providing a greater matching region. Using the above guiding principle may set up the requirements for design of the thin-layered radio wave absorber, which is not more than 1 mm in thickness and achieves the absorption characteristics of not less than −20 dB for the useless radio wave in the frequency band of 2.45 GHz required for a large number of electronic equipment such as an electronic oven, a portable information terminal and a wireless LAN.

Figure 11:
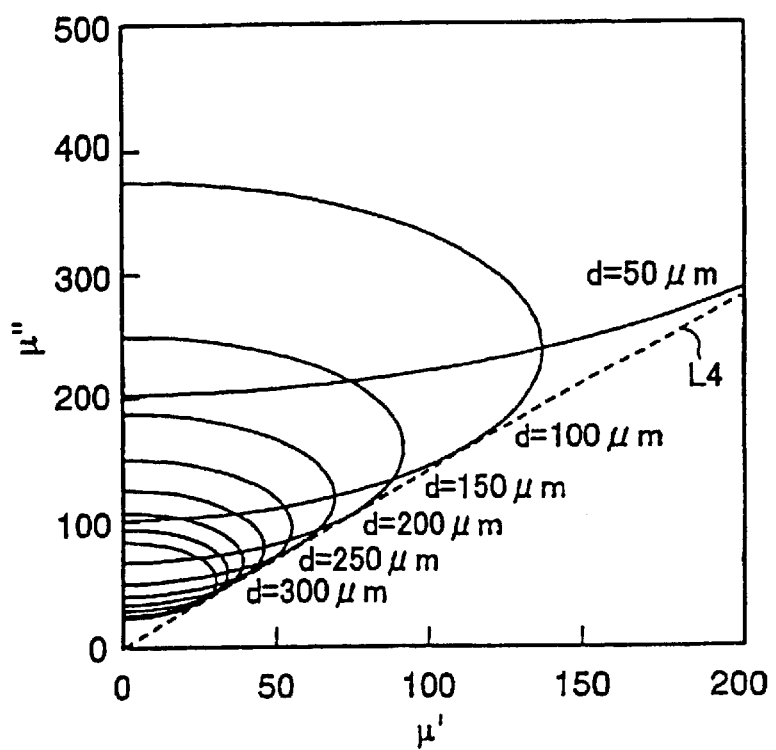
FIG. 11 shows a matching region sufficient to achieve absorption characteristics of not less than −10 dB in a case where the relative permittivity ∈ of the magnetic layer is assumed to be 1 when using the single-layered radio wave absorber.
Figure 1:
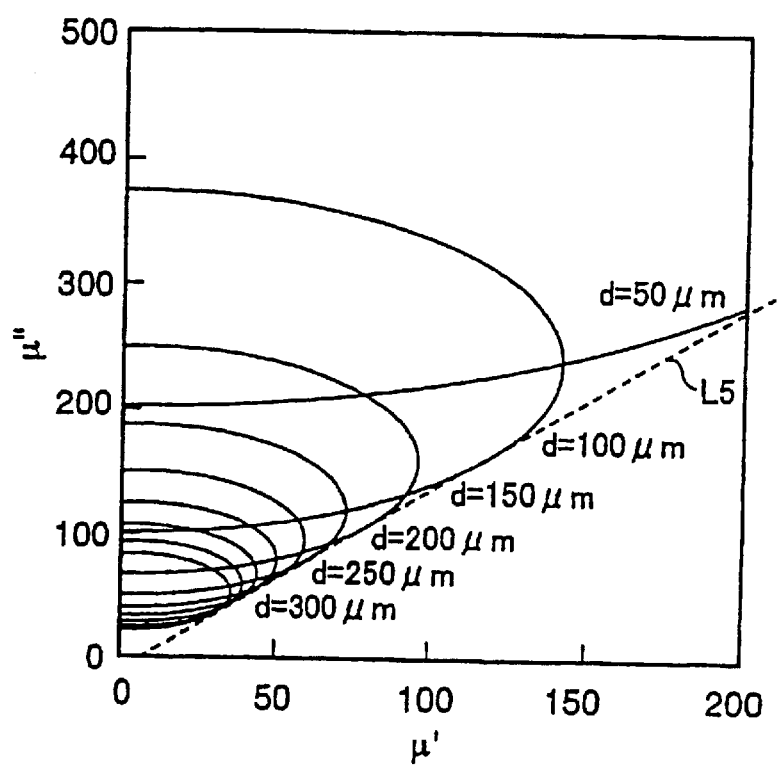
Figure 13:
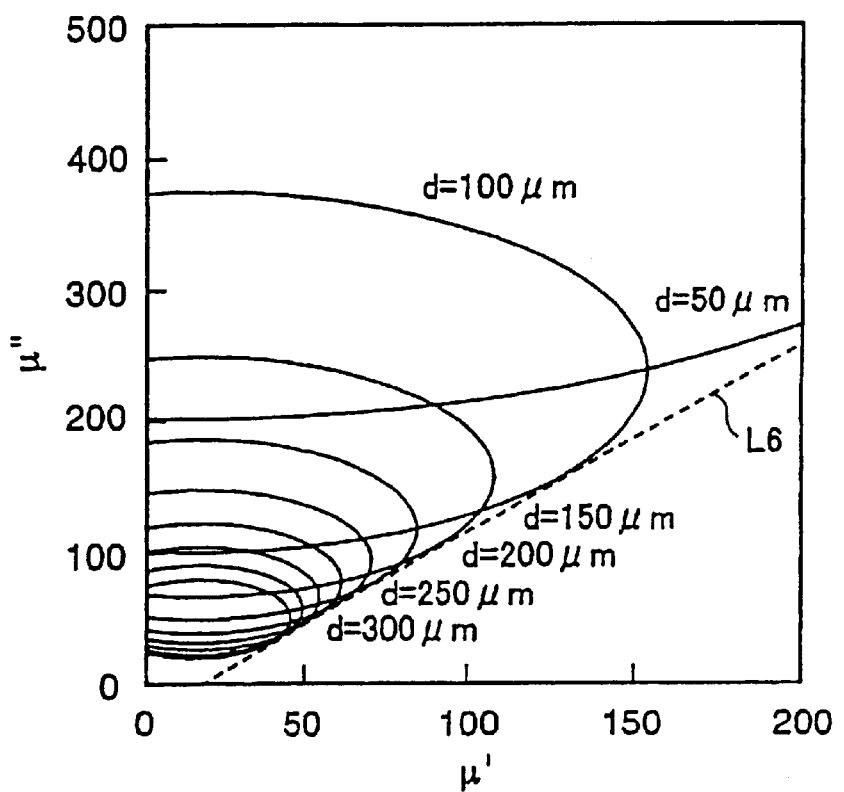
FIG. 13 shows a matching region sufficient to achieve absorption characteristics of not less than −10 dB in a case where the relative permittivity ∈ of the magnetic layer is assumed to be 50 when using the single-layered radio wave absorber.
Figure 1:
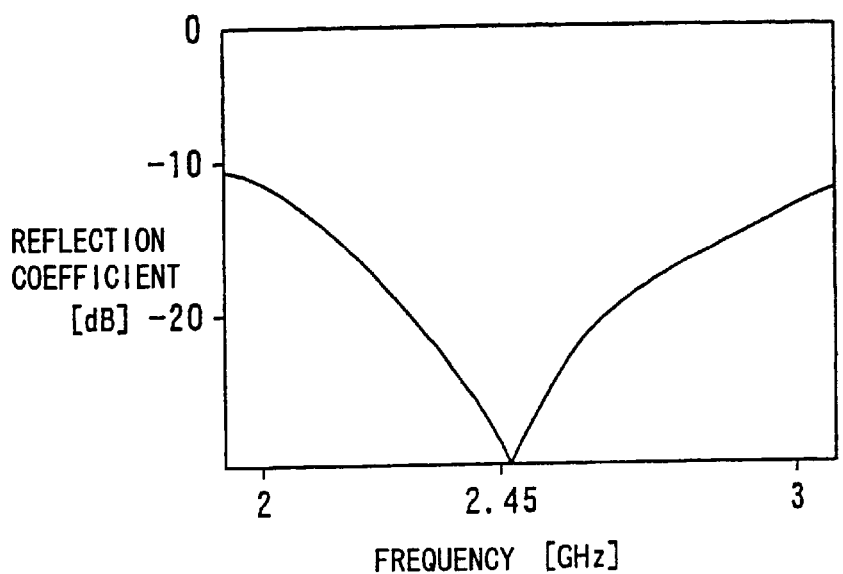

From the standpoint that effects as the radio wave absorber are accepted so long as not less than −10 dB is achieved, verifications on the guiding principle on selection of the material for the magnetic layer to achieve the absorption characteristics of not less than −10 dB will be given next. FIG. 11 shows a matching region in a case where the relative permittivity $\in$ of the magnetic layer is assumed to be 1. FIG. 12 shows a matching region in the case where the relative permittivity $\in$ is assumed to be 15. FIG. 13 shows a matching region in the case where the relative permitivity $\in$ is assumed to be 50. A description will now be given of verifications on the values of m and n to meet the absorption characteristics of −10 dB with reference to FIGS. 11, 12 and 13.

Referring to FIGS. 11, 12 and 13, the relative magnetic permeability $\mu$ required for the magnetic layer to meet the amount of absorption of −10 dB increases with the decreasing thickness d, similarly to the case of aiming at the absorption characteristics of −20 dB. The matching regions appear on the left side of a straight line given at a certain gradient in each of FIGS. 11, 12 and 13. The straight line as described above is shown by dotted lines as L4, L5 and L6 respectively in FIGS. 11, 12 and 13. Expressing each of the straight lines L4, L5 and L6 in terms of $\mu''=m\mu'-n$ gives m=1.4 and n=0 from FIG. 11 when the relative permittivity $\in$ is 1, gives m=1.3 and n=5 from FIG. 12 when the relative permittivity $\in$ is 15, and gives m=1.4 and n=25 from FIG. 13 when the relative permittivity $\in$ is 50.

According to the above results, the guiding principle for achievement of the return loss of not less than 10 dB for the target electromagnetic wave in the frequency band of 2.4 to 2.5 GHz when using the single-layered impedance-matching radio wave absorber may be set up on the basis of the values of $1.2 \leq m \leq 1.5$ and $n \leq 10$ when the relative permittivity $\in$ of the magnetic layer is not more than 15 on condition that the relation between the real part $\mu'$ and the imaginary part $\mu''$ of the complex relative magnetic permeability of the material for the magnetic layer is given by the expression of $\mu'' \geq m\mu'-n$, while being set up on the basis of the values of $1.3 \leq m \leq 1.5$ and $n \leq 30$ when the relative permittivity $\in$ of the magnetic layer is not more than 50. As described above, with the increasing value of the relative permittivity $\in$ of the magnetic layer, the value of n gradually increases without a greater change of the value of m, providing a greater matching region. When there is a need for design in case of reducing the target absorption characteristics to a lower level like −10 dB, the matching region based on the single-layered radio wave absorber increases with the decreasing value of m, providing a greater tolerance on design.

A description will now be given of an embodiment of the wave absorber implemented on the basis of the above requirements for design. This embodiment aims at providing the radio wave absorber, which meets the absorption characteristics of −20 dB for the electromagnetic wave in the frequency band of 2.45 GHz and also the thickness of not more than 1 mm.

First of all, it is necessary for a material fit for the magnetic layer to have high relative magnetic permeability enough to cover the high frequency band. In general, high saturated-magnetic flux density is required to achieve high magnetic permeability, and in this connection, FeCo alloy is known as a material, which meets the above requirements. In the present invention, high magnetic permeability and high electric resistance were achieved by using the FeCo alloy and besides, by keeping up a nano-granular structure taking the shape of fine texture composed of fine magnetic particles limited in particle size to 1 to 100 nm and extremely thin grain boundaries based on high resistance substance such as $Al_2O_3$ or like ceramics surrounding the magnetic fine particles by precipitation or the like.

Such a FeCo metal soft magnetic material may be used to combine with a generally available polymeric material into the shape of a sheet as the radio wave absorber. When using this means, the above magnetic material will be prepared in the shape of powder having the nano-granular structure. The suitable particle size is in a range from 10 to 50 nm in consideration of the need for filling to powder. The thickness of the grain boundaries is preferably limited to not more than a skin depth, which is assumed to be about 1 m, so that the grain boundaries of about 0.1 to 3 μm in thickness are required. That is, in terms of aspect ratio, the powder material is assumed to be in a range from 50/0.1=500 at a maximum to 3/10=about 0.3 at a minimum. Using three pieces of rolls to knead the above powder material dispersed into a polymeric material at a volume filling rate of 30 to 60% produces a paste-like sample, which is then leveled to a predetermined thickness by a doctor blade process into the shape of a sheet. As the polymeric material, chlorinated polyethylene, rubber materials, ABS resins, and poly-lactic acid having biodegradation or the like may be used, or alternatively, thermosetting resins, photo-curing resins or the like may be used for hardening. Use may be also made of concrete, ceramics or the like, instead of the polymeric material.

The sheet-shaped material as described above was used to produce the single-layered radio wave absorber as shown in FIG. 1, as the first embodiment. Use of the above material was capable of producing a sample that the real part $\mu'$ and the imaginary part $\mu''$ of the complex relative magnetic permeability of the magnetic layer respectively take values of 5 and 80, resulting in achievement of the satisfactory absorption characteristics on condition that the thickness of the magnetic layer is reduced to a far smaller value as much as 200 μm than that in the conventional art. FIG. 14 shows the radio wave absorption characteristics in the first embodiment.

As shown in FIG. 14, in the first embodiment, the absorption characteristics of not less than −20 dB are achieved for a TEM wave (Transverse Electric Magnetic wave) from the front face in the frequency band around 2.45 GHz, providing the return loss of not less than 99%. Thus, effective elimination of useless radio wave is possible in the frequency band required for the large number of electronic equipment such as the electronic oven, the portable information terminal and the wireless LAN. The same absorption characteristics are also achieved in a wide frequency band of about 2 to 3 GHz in the first embodiment, as to the absorption characteristics of not less than −10 dB, at which the effects as the radio wave absorber are to be generally accepted. Incidentally, aluminum foil was used for a backing conductor of the magnetic layer. As the backing conductor, a carbon film, an ITO (Indium Tin Oxide) film and other various kinds of metal films may be used without being limited to the aluminum foil. These films may be produced as a vacuum-evaporation film or a sputtering film, or alternatively, a metal face of a structure on which the radio wave absorber is installed may be made equivalent to the backing conductor.

Then, the above material was used to produce the radio wave absorber having the radio wave absorptive layer of a multi-layered structure having the dielectric layer and the magnetic layer as shown in FIG. 6, as the second embodiment. In the second embodiment, the radio wave absorber was produced by the steps of dispersing $BaO-TiO_2$ ceramics into a polymeric material used as a base material to form a dielectric layer as the sheet-shaped material, then pressure-bonding the dielectric layer with a magnetic layer consisting of the same material as that in the first embodiment after leveling the dielectric layer and the magnetic layer to a predetermined thickness, and then backing the magnetic layer with the aluminum foil. As the backed conductor, the materials other than the aluminum foil and the processes similar to those in the first embodiment will be also enough. Use of the above material was capable of producing a sample that the dielectric constants of the dielectric layer and the magnetic layer respectively take values of 300 and 15 and the real part $\mu'$ and the imaginary part " of the complex relative magnetic permeability respectively take values of 80 and 50, resulting in achievement of the absorption characteristics of not less than −20 dB for the electromagnetic wave in the frequency band of 2.45 GHz on condition that the thickness of the dielectric layer and that of the magnetic layer are respectively limited to 30 μm and 120 μm, in total 150 μm.

In the above radio wave absorber, the satisfactory absorption characteristics for the high frequency electromagnetic wave may be achieved with the thickness of not more than 1 mm, while there has been need for a thickness of about not less than 1 cm in the conventional art. It is extremely effective in incorporating the above radio wave absorber in the small-sized electronic equipment such as the portable information terminal, for instance, since demands for smaller size and lighter weight are satisfied. The radio wave absorber produced according to the above method may be applied to a radio wave absorption panel and a radio wave absorption casing, without being limited to a wave absorption sheet formed in the shape of a sheet. The method for producing the radio wave absorber by kneading the magnetic material with the polymeric material makes it possible to easily form the thin-layered radio wave absorber by the steps of producing a paste-like or liquid sample in a manner of controlling the volume filling rate of the magnetic material, and then coating the face of a panel-shaped body or an electronic equipment casing with the sample by spraying or the like.

Incidentally, as the magnetic material used for the magnetic layer, either a material containing at least one of Fe, Co and Ni or an alloy containing Mn such as MmAl, CnzMnAl and MnBi may be used, without being limited to the above material. As the dielectric material used for the dielectric layer, ceramics such as $PbTiO_3$—$PbZrO_3$ (PZT ceramics), $PbO_2$—$Li_2O_3$—$ZrO_2$—$TiO_2$ (PLTZ ceramics), $MgTiO_3$—$CaTiO_3$, $BaMg_{1-x}Ta_xO_3$, $BZn_{1-x}Ta_xO_3$, $Ba_2TiO_2$, $Zr_{1-x}Sn_xTiO_4$, $BaO$—$Nd_2O_3$—$TiO_2$, $Pb_{1-x}Ca_xZrO_3$ and $PbTiO_3$—$PrZrO_3$—$PbB_{1(1-x)}B_{2(x)}O_3$ or like ceramics may be used, without being limited to $BaO$—$TiO_2$ ceramics described the above.

INDUSTRIAL AVAILABILITY

As has been described in the foregoing, the radio wave absorber according to the present invention, even when having the magnetic layer of not more than 1 mm in thickness, may achieve the satisfactory absorption characteristics for the high frequency electromagnetic wave by adopting the structure that the conductor is fixedly attached to the face opposite to the electromagnetic-wave incident face of the magnetic layer of single-layered structure, and also by arranging the magnetic layer on the assumption that the values of the real part $\mu'$ and the imaginary part $\mu''$ of the complex magnetic permeability of the magnetic layer satisfy the expression of $\mu'' \geq m\mu'-n$ (m: real number of m>0, and n: real number of $n \geq 0$) outside the impedance mismatching region.

The radio wave absorber according to the present invention, even when having the magnetic layer of not more than 1 mm in thickness, may also achieve the satisfactory absorption characteristics for the high frequency electromagnetic wave by adopting the structure that the conductor is fixedly attached to the face opposite to the electromagnetic-wave incident face of the wave absorptive layer including the magnetic layer and also by arranging the magnetic-layer on the assumption that the values of the real part $\mu'$ and the imaginary part $\mu''$ of the complex magnetic permeability of the magnetic layer satisfy the expression of $\mu'' \leq m\mu'-n$ (m: real number of m>0, n: real number of $n \geq 0$) outside the impedance mismatching region.

What is claimed is:

1. In an impedance-matching radio wave absorber, a radio wave absorber comprising a magnetic layer having a thickness of not more than 1 mm and arranged to have values of a real part $\mu'$ and an imaginary part $\mu''$ of complex relative magnetic permeability satisfying an expression of $\mu'' \geq m\mu'-n$ (m: real number of m>0, n: real number of $n \geq 0$) outside an impedance mismatching region, and a conductor fixedly attached to a face opposite to an electromagnetic-wave incident face of said magnetic layer.

2. A radio wave absorber according to claim 1, wherein $4 \leq m \leq 6$ and $n \leq 30$ are required, when a return loss of not less than 20 dB is achieved for said electromagnetic wave in a frequency band of 2.4 to 2.5 GHz on condition that the relative permittivity of said magnetic layer is not more than 15.

3. A radio wave absorber according to claim 1, wherein $4 \leq m \leq 6$ and $n \leq 100$ are required, when a return loss of not less than 20 dB is achieved for said electromagnetic wave in a frequency band of 2.4 to 2.5 GHz on condition that relative permittivity of said magnetic layer is not more than 50.

4. A radio wave absorber according to claim 1, wherein $1.2 \leq m \leq 1.5$ and $n \leq 10$ are required, when a return loss of not less than 10 dB is achieved for said electromagnetic wave in a frequency band of 2.4 to 2.5 GHz on condition that relative permittivity of said magnetic layer is not more than 15.

5. A radio wave absorber according to claim 1, wherein $1.3 \leq m \leq 1.5$ and $n \leq 30$ are required, when the a return loss of not less than 10 dB is achieved for said electromagnetic wave in a frequency band of 2.4 to 2.5 GHz on condition that relative permittivity of said magnetic layer is not more than 50.

6. A radio wave absorber according to claim 1, wherein said magnetic layer contains a magnetic material having a fine textural structure limited in a particle size in a range of 1 to 100 nm.

7. A radio wave absorber according to claim 6, wherein said magnetic material includes either a material containing at least one of Fe, Co and Ni or an alloy containing Mn.

8. A radio wave absorber according to claim 6, wherein said magnetic layer is formed by dispersion of said magnetic material in a shape of powder into any of a polymeric material, concrete and ceramics.

9. A radio wave absorption sheet, comprising the radio wave absorber according to claim 1.

10. A radio wave absorption panel, comprising the radio wave absorber according to claim 1.

11. A radio wave absorption casing, comprising the radio wave absorber according to claim 1.

* * * * *